United States Patent
Markl et al.

(10) Patent No.: US 9,638,778 B2
(45) Date of Patent: May 2, 2017

(54) METHODS AND SYSTEMS FOR IMPROVING SNR IN MULTI-SLICE MULTI-SEGMENT MAGNETIC RESONANCE IMAGING

(71) Applicants: Michael Markl, Chicago, IL (US);
Bruce S Spottiswoode, Chicago, IL (US)

(72) Inventors: Michael Markl, Chicago, IL (US);
Bruce S Spottiswoode, Chicago, IL (US)

(73) Assignees: Northwestern University, Evanston, IL (US); Siemens Healthcare GmbH, Erlangen (DE)

( * ) Notice: Subject to any disclaimer, the term of this patent is extended or adjusted under 35 U.S.C. 154(b) by 687 days.

(21) Appl. No.: 14/097,858

(22) Filed: Dec. 5, 2013

(65) Prior Publication Data
US 2014/0159720 A1    Jun. 12, 2014

Related U.S. Application Data

(60) Provisional application No. 61/736,074, filed on Dec. 12, 2012.

(51) Int. Cl.
*G01R 33/48*    (2006.01)
*G01R 33/483*   (2006.01)
(Continued)

(52) U.S. Cl.
CPC ... *G01R 33/4835* (2013.01); *G01R 33/56325* (2013.01); *G01R 33/5673* (2013.01)

(58) Field of Classification Search
CPC ......... G01R 33/4835; G01R 33/56325; G01R 33/5673; G01R 33/5619; G01R 33/56509;
(Continued)

(56) References Cited

U.S. PATENT DOCUMENTS

| 4,665,367 A * | 5/1987 | Kramer | G01R 33/4835 324/309 |
| 2008/0077008 A1* | 3/2008 | Moll | G01R 33/4835 600/425 |

(Continued)

OTHER PUBLICATIONS

Johnson G, Wadghiri YZ, Turnbill DH (1999), "2D multislice and 3D MRI sequences are often equally sensitive", Magnetic Resonance in Medicine, 41: 824-828.

(Continued)

*Primary Examiner* — Clayton E Laballe
*Assistant Examiner* — Ruifeng Pu

(57) ABSTRACT

A method for operating a Magnetic Resonance (MR) imaging system includes generating radio frequency (RF) excitation pulses in patient anatomy to provide subsequent acquisition of associated RF echo data and generating slice select magnetic field gradients for phase encoding and readout RF data acquisition in the patient anatomy. The method also includes acquiring a plurality of slices of an image within a plurality of cycles, each of the plurality of slices being acquired within each of the plurality of cycles and causing, by a control processor, a RF signal generator and a gradient generator to change an order that each of the plurality of slices is acquired between consecutive cycles of the plurality of cycles.

20 Claims, 10 Drawing Sheets

(51) Int. Cl.
*G01R 33/563* (2006.01)
*G01R 33/567* (2006.01)

(58) Field of Classification Search
CPC .............. G01R 33/4818; G01R 33/561; G01R 33/5613; G01R 33/5617; G01R 33/56341; G01R 33/5676; A61B 5/7207; A61B 5/7285; A61B 6/469; A61B 6/541; A61B 2576/023
See application file for complete search history.

(56) References Cited

U.S. PATENT DOCUMENTS

| | | | | |
|---|---|---|---|---|
| 2008/0284431 | A1* | 11/2008 | Fishkin | G01R 33/561 324/307 |
| 2011/0130644 | A1* | 6/2011 | Stemmer | A61B 5/055 600/410 |
| 2011/0181285 | A1* | 7/2011 | Greiser | A61B 5/055 324/309 |
| 2011/0234223 | A1* | 9/2011 | McColl | G01R 33/56509 324/309 |
| 2015/0123659 | A1* | 5/2015 | Weingartner | A61B 5/055 324/309 |

OTHER PUBLICATIONS

McCormack EJ, Egnorb MR, Wagshulc ME (2007), "Improved cerebrospinal fluid flow measurements using phase contrast balanced steady-state free precession", Magnetic Resonance Imaging, 25: 172-182.

* cited by examiner

METHODS AND SYSTEMS FOR IMPROVING SNR IN MULTI-SLICE MULTI-SEGMENT MAGNETIC RESONANCE IMAGING

CROSS-REFERENCE TO RELATED APPLICATIONS

The present application claims priority to U.S. provisional application Ser. No. 61/736,074 filed Dec. 12, 2012, which is incorporated herein by reference in its entirety.

TECHNOLOGY FIELD

The present application relates generally to methods, systems, and apparatuses for providing an increase in magnetization recovery times during cardiac imaging using a Magnetic Resonance (MR) imaging system, and in particular, to methods, systems, and apparatuses for changing an order of acquisition of each acquired slice between consecutive cardiac cycles to provide an increase in magnetization recovery times between consecutive acquisitions of the same slices.

BACKGROUND

Magnetic resonance (MR) imaging is a medical imaging technique that uses an applied magnetic field and radio frequency (RF) pulses to make images (e.g., via slices) of organs and structures inside the body. During MR imaging, the magnetic field causes magnetic field vectors of protons (typically in hydrogen atoms) to align with the magnetic field. The RF pulses cause the magnetic field vectors of the protons to be displaced (e.g., rotate) relative to the magnetic field and re-align with the magnetic field. An MRI scanner picks up signals from the protons in the body that result from magnetization field vectors re-aligning with the magnetic field. The signals may then be converted into images based on the location and strength of the incoming signals.

The achievable signal-to-noise ratio (SNR) for gradient echo (GRE) MR imaging is related to, among other things, the repetition time (TR) that exists between successive RF pulses applied to the same slice of an image, the flip angle θ to which the net magnetization is rotated relative to the magnetic field, and the relaxation time (T1) for the protons to return to their equilibrium distribution. During cardiac GRE imaging, TR is typically kept as short as possible to provide a short acquisition time to collect image data. A shorter TR, however, may result in signal saturation and low SNR, particularly for fluids and tissues with long T1 time, such as water, cerebrospinal fluid or blood.

SUMMARY

Embodiments of the present invention include a method for operating a Magnetic Resonance (MR) imaging system. The method includes generating radio frequency (RF) excitation pulses in patient anatomy to provide subsequent acquisition of associated RF echo data and generating slice select magnetic field gradients for phase encoding and readout RF data acquisition in the patient anatomy. The method also includes acquiring a plurality of slices of an image within a plurality of cycles, each of the plurality of slices being acquired within each of the plurality of cycles and causing, by a control processor, a RF signal generator and a gradient generator to change an order that each of the plurality of slices is acquired between consecutive cycles of the plurality of cycles.

According to one embodiment, the method further includes changing the order that each of the plurality of slices is acquired between consecutive cycles to provide magnetization recovery time multiples between consecutive acquisitions of same slices that are equal to or greater than a predetermined magnetization recovery time threshold value.

According to another embodiment, the plurality of slices is equal to n number of slices and the predetermined magnetization recovery time multiple threshold value is equal to one less than n number of slices.

In one embodiment, the method further includes changing the order that each of the plurality of slices is acquired between consecutive cycles to provide different magnetization recovery times between consecutive acquisitions of at least two of the acquired plurality of slices.

In another embodiment, the method further includes changing the order that each of the plurality of slices is acquired between consecutive cycles to provide substantially equal magnetization recovery times between each of the consecutive acquisitions of the same slices.

According to one embodiment, the method further includes changing the order that each of the plurality of slices is acquired between consecutive cycles to provide an average magnetization recovery time between each of the consecutive acquisitions of the same slices within each cycle that is equal to or greater than a predetermined average magnetization recovery time threshold value.

According to another embodiment, acquiring the plurality of slices of an image within a plurality of consecutive cycles further includes acquiring at least three slices of the plurality of slices.

In one embodiment, causing the RF signal generator and the gradient generator to change an order that each of the plurality of slices is acquired further includes interleaving the acquisition of the plurality of slices.

Embodiments of the present invention include a multi-slice, multi-segment magnetic resonance (MR) imaging system that includes a radio frequency (RF) signal generator configured to generate RF excitation pulses in patient anatomy and enabling subsequent acquisition of associated RF echo data and a magnetic field gradient generator configured to generate slice select magnetic field gradients for phase encoding and readout RF data acquisition in the patient anatomy. The system also includes a plurality of RF coils configured to acquire a plurality of slices of an image within a plurality of cycles, each of the plurality of slices being acquired within each of the plurality of cycles. The system further includes a controller configured to cause: (i) the RF signal generator to generate the RF excitation pulses; and (ii) the magnetic field generator to generate the corresponding slice select magnetic field gradients to change an order that each of the plurality of slices is acquired between consecutive cycles of the plurality of cycles.

According to one embodiment, the controller is further configured to cause: (i) the RF signal generator to generate the RF excitation pulses; and (ii) the magnetic field generator to generate the corresponding slice select magnetic field gradients to change the order that each of the plurality of slices is acquired between consecutive cycles to provide magnetization recovery times between consecutive acquisitions of same slices that are equal to or greater than a predetermined magnetization recovery time threshold value.

According to another embodiment, the plurality of slices is equal to n number of slices and the predetermined magnetization recovery time threshold value is equal to one less than n number of slices.

In one embodiment, the controller is further configured to cause: (i) the RF signal generator to generate the RF excitation pulses; and (ii) the magnetic field generator to generate the corresponding slice select magnetic field gradients to change the order that each of the plurality of slices is acquired between consecutive cycles to provide different magnetization recovery times between consecutive acquisition of at least two of the acquired plurality of slices.

In another embodiment, the controller is further configured to cause: (i) the RF signal generator to generate the RF excitation pulses; and (ii) the magnetic field generator to generate the corresponding slice select magnetic field gradients to change the order that each of the plurality of slices is acquired between consecutive cycles to provide substantially equal magnetization recovery times between each of the consecutive acquisitions of the same slices.

According to one embodiment, the controller is further configured to cause: (i) the RF signal generator to generate the RF excitation pulses; and (ii) the magnetic field generator to generate the corresponding slice select magnetic field gradients to change the order that each of the plurality of slices is acquired between consecutive cycles to provide an average magnetization recovery time between each of the consecutive acquisitions of the same slices within each cycle that is equal to or greater than a predetermined average magnetization recovery time threshold value.

According to another embodiment, the plurality of RF coils is configured to acquire at least three slices of the plurality of slices.

In yet another embodiment, the controller is further configured to cause: (i) the RF signal generator to generate the RF excitation pulses; and (ii) the magnetic field generator to generate the corresponding slice select magnetic field gradients to change the order that each of the plurality of slices is acquired by interleaving the acquisition of the plurality of slices.

Embodiments of the present invention include an article of manufacture for operating a multi-slice, multi-segment magnetic resonance (MR) imaging system. The article of manufacture includes a non-transitory, tangible computer-readable medium holding computer-executable instructions for performing a method. The method includes generating radio frequency (RF) excitation pulses in patient anatomy to provide subsequent acquisition of associated RF echo data and generating slice select magnetic field gradients for phase encoding and readout RF data acquisition in the patient anatomy. The method also includes acquiring a plurality of slices of an image within a plurality of consecutive cycles, each of the plurality of slices being acquired within each of the plurality of consecutive cycles and causing an order of acquisition of each of the plurality of slices to change between the plurality of consecutive cycles.

According to one embodiment, causing an order of acquisition of each of the plurality of slices to change between the plurality of consecutive cycles provides magnetization recovery times between consecutive acquisitions of same slices that are equal to or greater than a predetermined magnetization recovery time threshold value.

According to one embodiment, the plurality of slices is equal to n number of slices and the predetermined magnetization recovery time threshold value is equal to one less than n number of slices.

According to yet another embodiment, causing an order of acquisition of each of the plurality of slices to change further includes changing the order to provide different magnetization recovery times between consecutive acquisition of at least two of the acquired plurality of slices.

DETAILED DESCRIPTION

Figure 1:
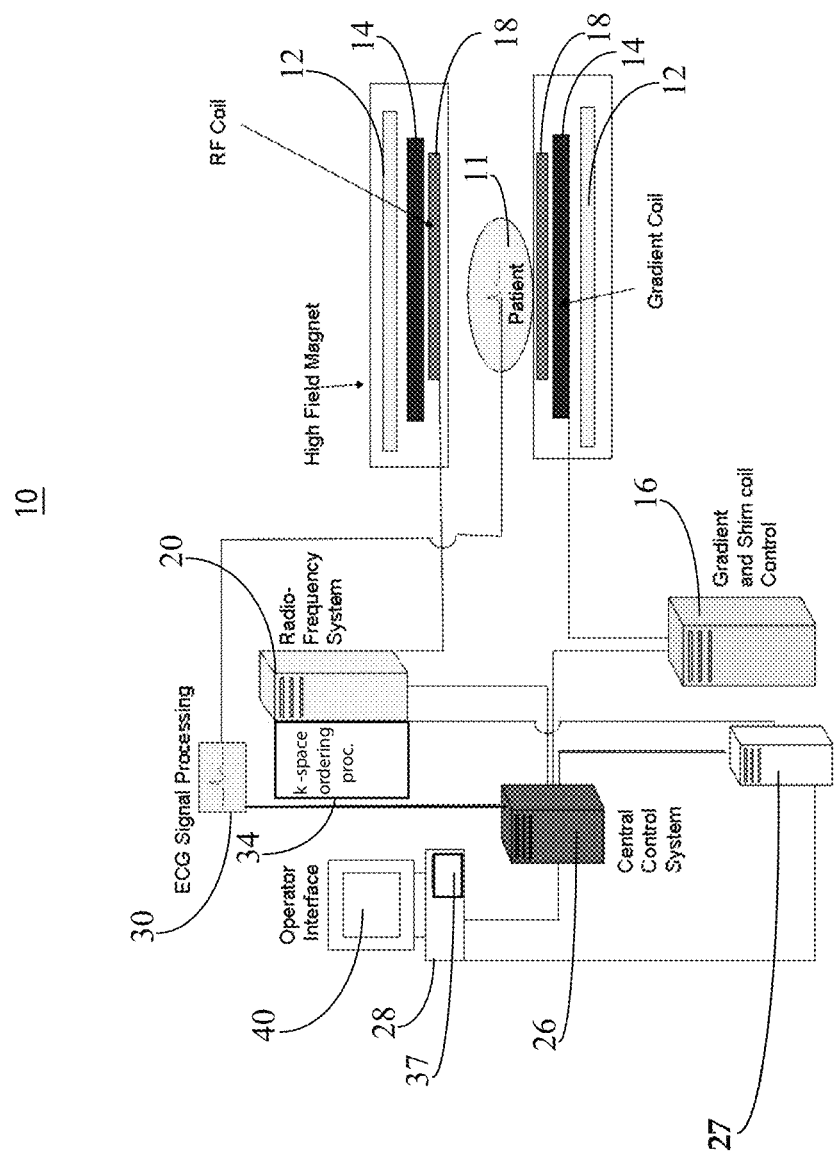
FIG. 1 is a system block diagram illustrating a system for acquiring MR imaging data of a portion of patient anatomy associated with proton spin lattice relaxation time in a rotating frame, for use with embodiments disclosed herein.

Terms and Concepts Associated with Some Embodiments

Echo planar imaging (EPI) for a single shot image includes image acquisition whereby a complete image is formed from a single data sample (k-space lines are acquired in one repetition time) of a gradient echo or spin echo sequence. Images may also be acquired via segmented EPI.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

Integrated Parallel Acquisition Techniques (iPAT) comprises "parallel imaging." iPAT enables faster scanning through reduced phase encoding and addition of RF coil information. An iPAT factor of 2 enables scanning about twice as fast, iPAT factor of 3 enables scanning about three times as fast and so on.

T1 is the longitudinal (or spin-lattice) relaxation time T1 decay constant and may determine the image contrast.

T2 is the transverse (or spin-spin) relaxation time and is the decay constant for a proton spin component.

TR is the repetition time, the time between successive RF excitation pulses.

FA is a flip angle (e.g., an RF flip angle). For an inversion pulse, FA=180 degrees.

A saturation pulse (or saturation recovery pulse) is an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.

Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition).

B0 is the main static base MRI magnetic field.
B1 is the RF transmit coil field.

Exemplary Embodiments

Short repetition times during cardiac GRE imaging may result in signal saturation and low signal-to-noise ratio (SNR), particularly for fluids and tissues with long T1 relaxation times, such as cerebrospinal fluid or blood. Embodiments of the present invention include systems and methods for providing short repetition times, while providing improved SNRs.

Embodiments of the present invention include systems and methods for increasing time for regrowth of the longitudinal magnetization component (MZ) of the net magnetization vector by reordering a slice acquisition series as a function of time in multi-slice, multi-phase imaging to change image contrast and improve signal-to-noise ratio. Embodiments of the present invention may temporally reorder slice acquisition to increase TR and, therefore, provide the available SNR for a multi-slice, multi-phase (time resolved) MRI acquisition.

Embodiments of the present invention may increase SNR without decreasing scan time. Embodiments of the present invention include systems and methods that differ from conventional slice interleaving, such as those used in multi-slice turbo spin echo imaging in conjunction with a multi-phase segmented acquisition. The longer TR introduces a T2 or proton density-weighting, which affects image contrast and limits its application in morphological imaging. Embodiments of the invention may be advantageous for cardiovascular phase-based methods, such as phase contrast velocity encoding.

FIG. 1 is a system block diagram illustrating a system 10 for acquiring MR imaging data of a portion of patient anatomy associated with proton spin lattice relaxation time in a rotating frame. As shown at FIG. 1, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase encoding gradient magnetic field and a readout gradient magnetic field that are applied to patient 11.

Further, RF (radio frequency) module 20 provides RF pulse signals to RF coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16, in conjunction with RF module 20 as directed by central control unit 26, control slice-selection, phase encoding, readout gradient magnetic fields, radio frequency transmission, and magnetic resonance signal detection to acquire magnetic resonance signals representing planar slices of patient 11.

In response to applied RF pulse signals, the RF coils 18 receive MR signals, For example, RF coils 18 may receive signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. In some embodiments, the image data processor (e.g. image data processor 27) may be external to the central control unit 26. ECG synchronization signal generator 30 provides ECG signals used for pulse sequence and imaging synchronization. A two or three dimensional k-space storage array of individual data elements in unit 34 stores corresponding individual frequency components comprising a MR dataset.

A RF (Radio Frequency) signal generator comprising module 20 and RF coils 18 generates RF excitation pulses in anatomy of patient 11 and enables subsequent acquisition of associated RF echo data. A magnetic field gradient generator (comprising magnetic coils 12 and 14) generates a magnetic field for use in acquiring multiple individual frequency components and generates magnetic field gradients for anatomical slice selection, phase encoding and readout RF data acquisition in a three dimensional (3D) anatomical volume. The RF signal generator units 18 and 20 and the magnetic field gradient generator units 12 and 14 provide a rotating frame preparation pulse sequence comprising at least one of: (a) a T1 spin lattice relaxation in a rotating frame (T1ρ) preparation pulse sequence of adiabatic pulses comprising modulated RF pulses and modulated magnetic field gradients for slice selection; and (b) a T2 spin-spin relaxation in a rotating frame (T2ρ) preparation pulse sequence of adiabatic pulses comprising modulated RF pulses and modulated magnetic field gradients for slice selection.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data, as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

An example of a conventional detected MR signal for a 2D RF spoiled gradient echo pulse sequence is shown below at Equation [1].

$$S(TR, T1, \theta) \propto M_0 \frac{\sin\theta(1 - e^{-\frac{TR}{T1}})e^{-\frac{TE}{T2}}}{1 - \cos\theta e^{-\frac{TR}{T1}}}$$ Equation [1]

$$S(TR, T1, \theta) \propto M_0 \frac{\sin\theta(1 - e^{-TR/T1})e^{-TE/T2*}}{1 - \cos\theta e^{-TR/T1}}$$

A maximum signal may be achieved by setting the flip angle equal to the Ernst Angle as shown below in Equation [2].

$$\theta_E = a\cos(e^{-TR/T1})$$ Equation [2]

By combining Equations 1 and 2 with basic trigonometric identities, the maximum signal may be as shown in Equation [3].

$$S(TR, T1, \theta_E) \propto M_0 \frac{(1 - e^{-TR/T1})e^{-TE/T2*}}{\sqrt{1 - e^{-2TR/T1}}}$$ Equation [3]

In Equation [3], $M_0$ is the longitudinal magnetization (MZ) after full recovery. Assuming that the imaging methods being compared have the same TE, the T2* dependence may not affect the relative SNR, resulting in Equation [4] shown below.

$$S(TR, T1, \theta_E) = k\frac{1 - e^{-\frac{TR}{T1}}}{\sqrt{1 - e^{-\frac{2TR}{T1}}}} = k\sqrt{\frac{1 - e^{-\frac{TR}{T1}}}{1 + e^{-\frac{TR}{T1}}}}$$ Equation [4]

$$S(TR, T1, \theta_E) = k\frac{(1 - e^{-TR/T1})}{\sqrt{1 - e^{-2TR/T1}}} = k\sqrt{\frac{1 - e^{-TR/T1}}{1 + e^{-TR/T1}}}$$

In Equation [4], k is a constant incorporating system gain, spin density, and T2 effects.

Embodiments of the present invention may incorporate temporal slice reordering into multi-slice, multi-phase 2D gradient echo imaging to increase TR and hence signal available during imaging while maintaining spatial (multi-slice) and temporal (cardiac time frames) coverage.

Figure 2A:
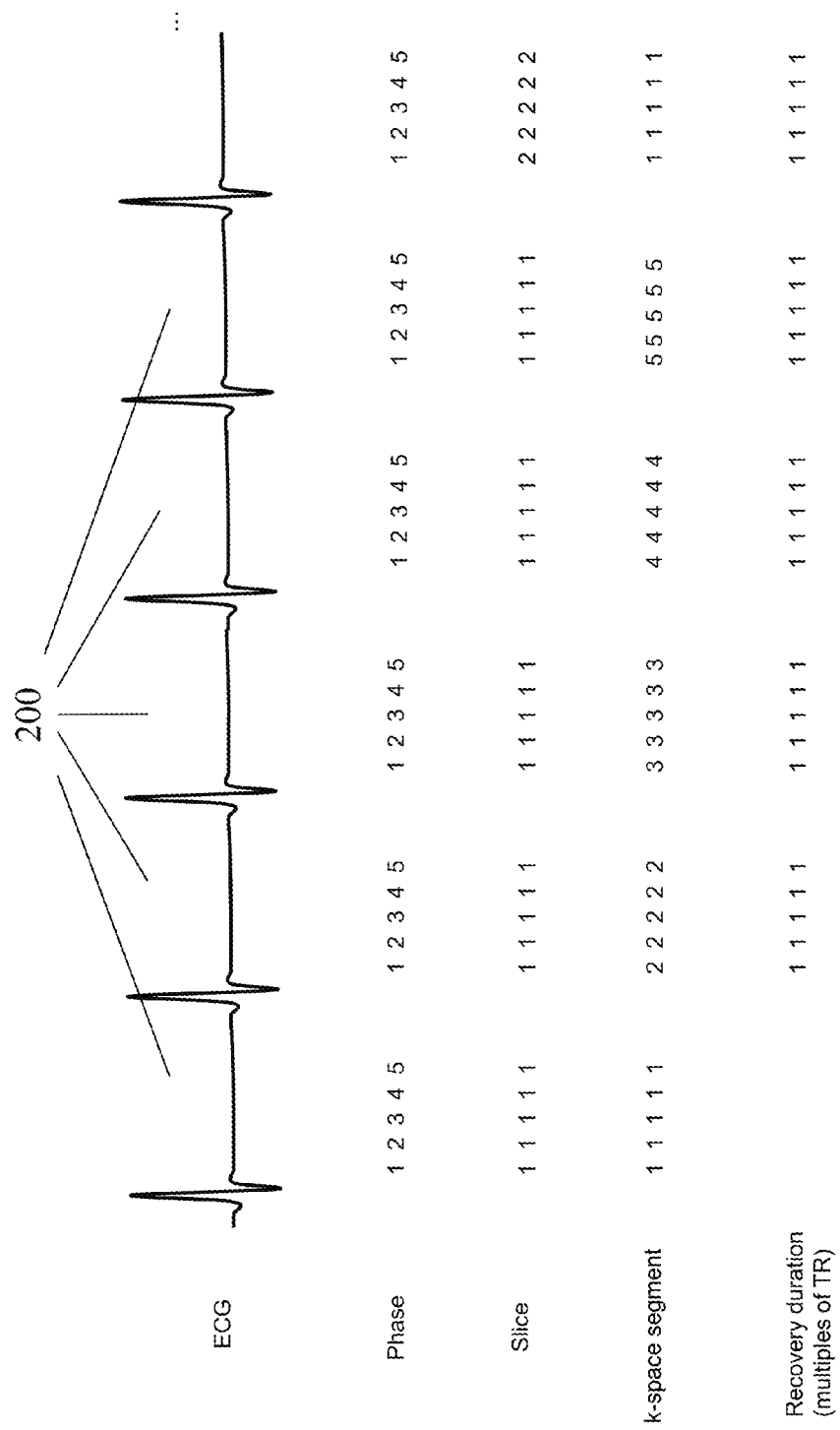
FIG. 2A is an illustration showing results of a sequential multi-slice, multi-phase imaging sequence for acquisition of 5 image slices and 5 time frames.

FIG. 2A is an illustration showing a conventional sequential multi-slice, multi-phase imaging sequence for acquisition of 5 image slices and 5 time frames. The first row (ECG) shows a plurality of heart beats having corresponding cycles 200 between each beat. The second row (Phase) shows 5 time intervals or phases (1, 2, 3, 4 and 5) within each cycle 200. The third row (Slice) shows the ordering of slices for each phase (time interval) within each cycle 200. As shown in the third row, slice 1 is acquired for each time interval of the first 5 cycles of cycles 200 before starting to acquire slice 2 in the sixth cycle of cycles 200.

The fourth row (k-space segment) of FIG. 2A shows a number of segments within each cycle 200. As shown in the fourth row, a k-space segment (fraction of k-space acquired during each cycle 200), for each slice is fully acquired or sampled for each time interval in the first cycle of cycles 200 before moving to a subsequent k-space segment. For example, k-space segment (1) for the first slice (1) is fully acquired for each time interval (1, 2, 3, 4 and 5) in the first cycle of cycles 200 before moving to a subsequent adjacent k-space segment (2). K-space segment (2) for the first slice (1) is then fully acquired for each time interval (1, 2, 3, 4 and 5) in the second cycle of cycles 200. The k-space segment (1) for the first slice (1) is then fully acquired for each time interval (1, 2, 3, 4 and 5) in the third cycle of cycles 200. This procedure then repeats in the subsequent cycles of cycles 200 until the k-space is fully sampled, corresponding to an image. The process then repeats for the second slice until the k-space for the second slice is fully sampled, and so on.

The fifth row (TR multiple) shows the recovery time (represented by a value 1) of MZ. The values of the recovery times shown in the fifth row correspond to the number of time intervals between acquisitions of the same slices. As shown in the fifth row, the recovery time (1) remains the same for each phase of the first 5 cycles of cycles 200 because slice 1 is acquired at each subsequent time interval for the first 5 cycles of cycles 200.

Figure 2B:
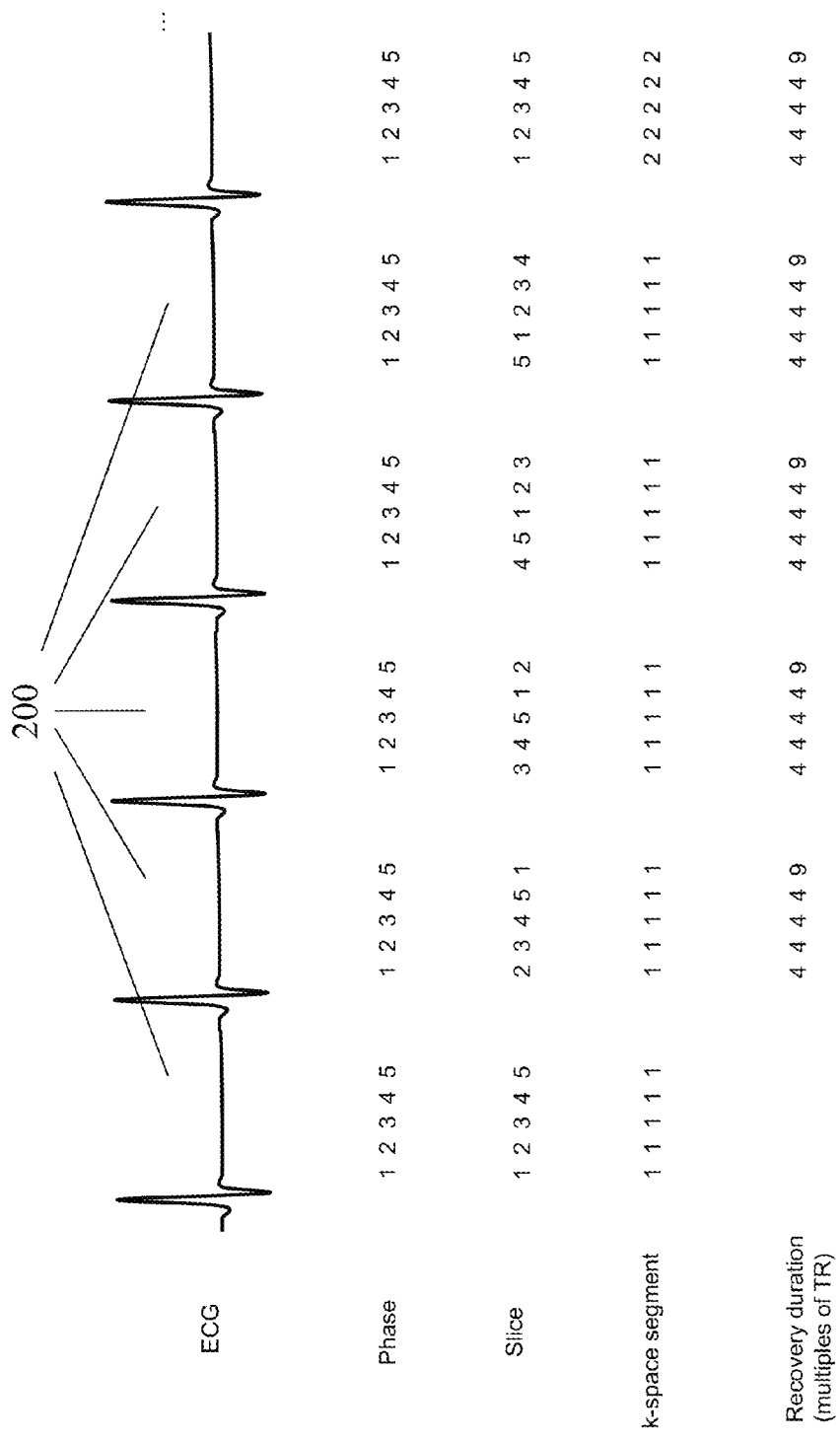
FIG. 2B is an illustration showing multi-slice, multi-phase system acquisition using temporal reordering of slices for increased longitudinal magnetization recovery time, for use with embodiments disclosed herein.

FIG. 2B is an illustration showing multi-slice, multi-phase system acquisition using temporal reordering of slices for increased longitudinal magnetization recovery time, for use with embodiments disclosed herein. The first row (ECG) and the second row (Phase) are the same as shown in FIG. 2A.

According to an embodiment of the invention, RF coils 18 may acquire a plurality of slices of an image within a plurality of cycles 200. For example, as shown in the Slice row of FIG. 2, slices (1, 2, 3, 4 and 5) of an image may be acquired within the cycles 200 and each slice (1, 2, 3, 4 and 5) is acquired within each of the cycles 200. Further, a control processor (e.g., central control unit 26), may cause one or more RF signal generators (e.g., RF signal generator units 18 and 20) and one or more gradient generators (e.g., magnetic field gradient generator units 12 and 14) to change the order that the slices are acquired between consecutive cycles (cycle 1, cycle 2, . . . ) of cycles 200. For example, as shown in cycle 1 of the Slice row of FIG. 2B, the slices are acquired in the order of 1, 2, 3, 4 and 5, respectively. In the next consecutive cycle (cycle 2), the slices are acquired in the order of 2, 3, 4, 5 and 1, respectively. In the next consecutive cycle (cycle 3), the order of acquisition of the slices are changed again to be acquired in the order 3, 4, 5, 1 and 2, respectively. As shown in each consecutive cycle, the order of acquisition of the slices changes. The reordering takes the form of a temporal shift, whereby the ordering of the temporal slice acquisition sequence is changed or shifted (and wrapped) at each cycle.

This continuous changing of the order of acquisition of the slices between consecutive cycles of cycles 200 may provide recovery times of MZ between consecutive acquisitions of the same slices that are greater (e.g., by several fold) than magnetization recovery times in conventional methods and systems without increasing scan times. In some embodiments, magnetization recovery times (e.g., values that are multiples of TR) between consecutive acquisitions of respective slices may be equal to or greater than a predetermined magnetization recovery time threshold value.

In one embodiment, the predetermined magnetization recovery time threshold value may be equal to a value that is one less than the number of slices of an image acquired.

For example, in the embodiment shown in FIG. 2B, there are 5 slices of an image acquired. The predetermined magnetization recovery time threshold value may be equal to 4 (1 less than 5 slices). Accordingly, the order of acquisition is changed between the first and second cycles of cycles 200 such that the magnetization recovery times between consecutive acquisitions of the same slices are equal to or greater than 4.

For example, as shown in the second cycle of cycles 200 in the recovery duration row in FIG. 2B, the magnetization recovery time between consecutive acquisitions of slice 2 in cycle 1 and slice 2 in cycle 2 is equal to 4 time intervals. The magnetization recovery times between consecutive acquisitions of slices 3, 4 and 5 in cycle 1, respectively, and slices 3, 4 and 5 in cycle 2, respectively, are also equal to 4 time intervals. The magnetization recovery time between consecutive acquisitions of slice 1 in cycle 1 and slice 1 in cycle 2 is equal to 9 time intervals. Accordingly, the changed order of acquisition between the first and second cycles of cycles 200 provide magnetization recovery times between consecutive acquisitions of the same slices that are equal to or greater than 4. For example, as shown in FIG. 2B, the order of acquisition between subsequent cycles of cycles 200 also provide magnetization recovery times of 4 and 9, which are equal to the minimum threshold value of 4 (one less than 5 slices).

Figure 2C:
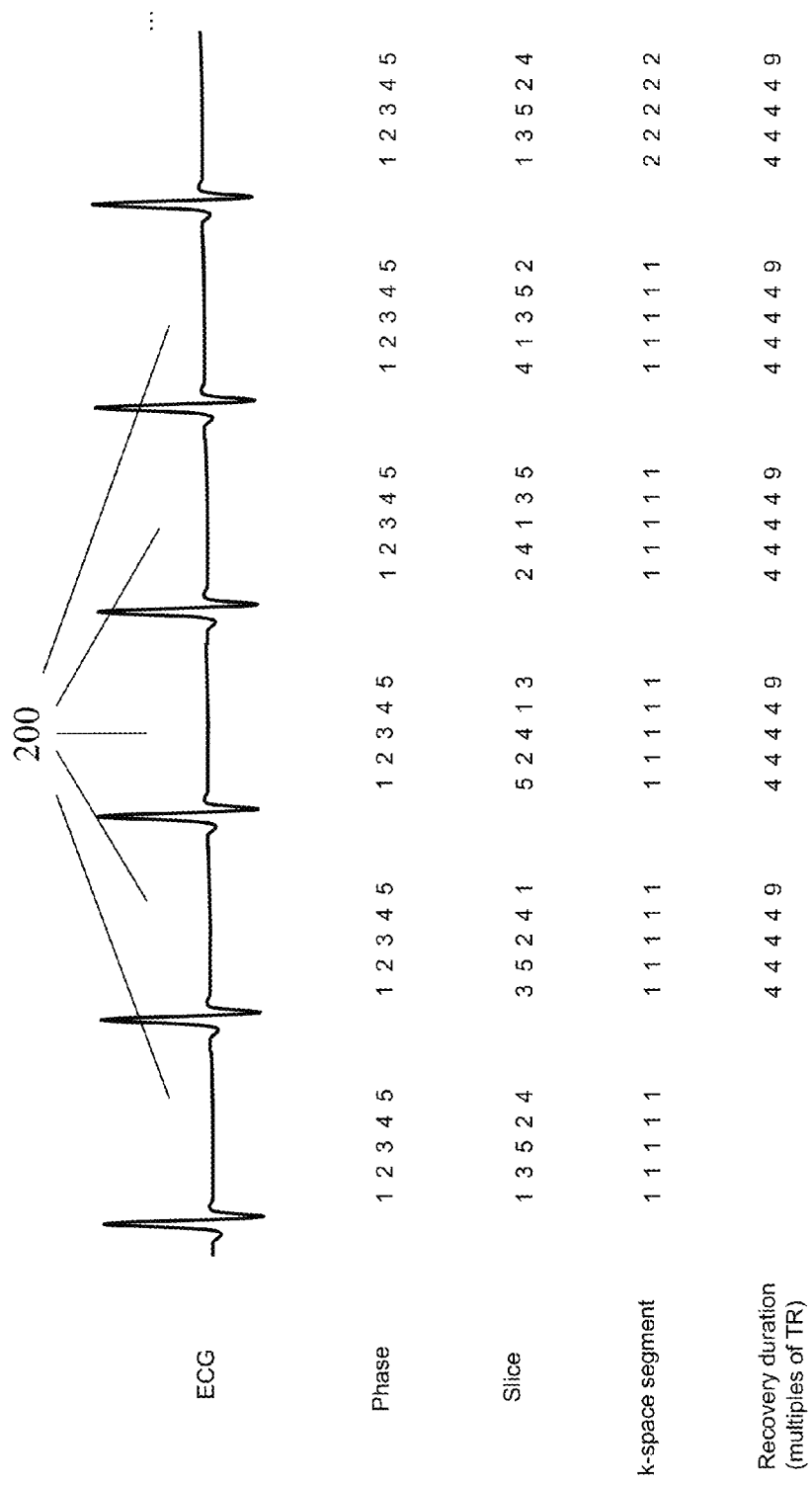
FIG. 2C is an illustration showing multi-slice, multi-phase system acquisition using slice interleaving incorporated with the temporal slice reordering (temporal shift) to minimize interference and magnetization loss from an imperfect slice profile, for use with embodiments disclosed herein.

FIG. 2C is an illustration showing multi-slice, multi-phase system acquisition using slice interleaving incorporated with the temporal reordering (temporal shift) to minimize interference and magnetization loss from an imperfect slice profile, for use with embodiments disclosed herein. As shown in FIG. 2C, the slices are acquired via interleaving within each cycle. The interleaving order of acquisition in the Slice row of FIG. 2C also provides magnetization recovery times of 4 and 9, which are equal to or greater than the minimum threshold value of 4.

The embodiments shown in FIG. 2B and FIG. 2C include acquisition of 5 slices. Embodiments may, however, include acquiring any number of slices greater than 2 slices. The embodiments shown in FIG. 2B and FIG. 2C also include 5 time intervals within each cycle. Embodiments may, however, include any number of time intervals within each cycle greater than 2 time intervals. The order of acquisition of slices between consecutive cycles of cycles 200 may vary depending on different factors, including but not limited to the number of slices acquired, the number of time intervals and the predetermined magnetization recovery time threshold value.

Figure 2D:
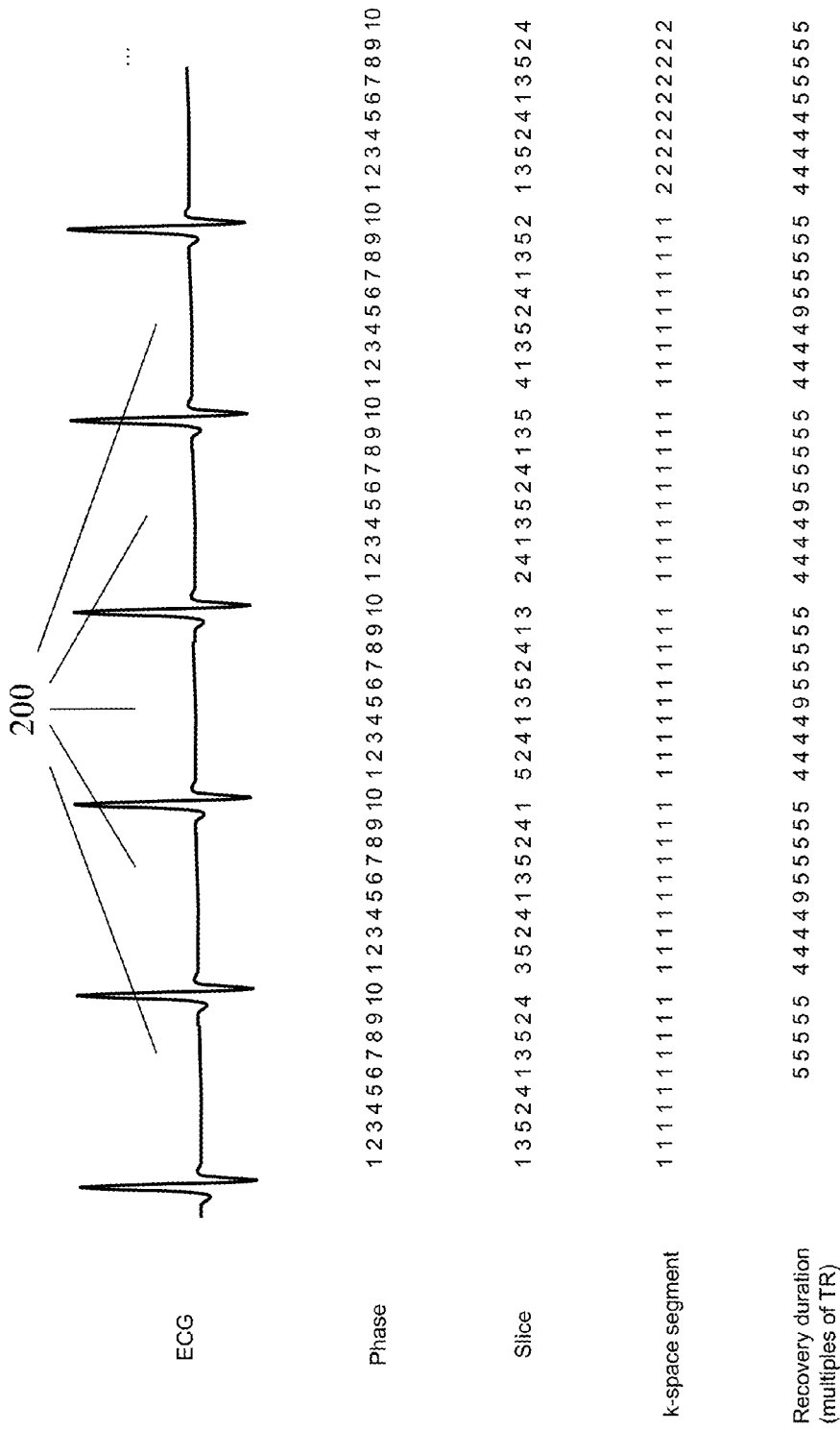
FIG. 2D is an illustration showing multi-slice, multi-phase system acquisition using 5 slices and 10 time intervals, incorporating both temporal slice reordering and spatial interleaving, for use with embodiments disclosed herein.

FIG. 2D is an illustration showing multi-slice, multi-phase system acquisition using 5 slices and 10 time intervals, incorporating both temporal reordering and spatial interleaving of slices for use with embodiments disclosed herein. As shown in FIG. 2D, the order of acquisition of the slices change between each consecutive cycle. The magnetization recovery times between acquisitions of slices 1, 3, 5, 2 and 4 (in cycle 1), respectively, and the next acquisition of slices 1, 3, 5, 2 and 4 (also in cycle 1), respectively, are equal to 5 time intervals. The magnetization recovery times between the second acquisitions of slices 3, 5, 2 and 4 (in cycle 1), respectively, and the next acquisition of slices 3, 5, 2 and 4 (in cycle 2), respectively, are equal to 4 time intervals. The magnetization recovery time between the second acquisition of slice 1 (in cycle 1) and the next acquisition of slice 1 (in cycle 2) is equal to 9 time intervals. The magnetization recovery times between the second acquisitions of slices 3, 5, 2, 4 and 1 (in cycle 2), respectively, and the next acquisition of slices 3, 5, 2, 4 and 1 (in cycle 2), respectively, are equal to 5 time intervals. Accordingly, the changed order of acquisition between the first and second cycles of cycles 200 provide magnetization recovery times (4, 5 and 9) between consecutive acquisitions of the same slices that are equal to or greater than a predetermined magnetization recovery time threshold value of 4 (one less than 5 slices). The order of acquisition between subsequent cycles of cycles 200 also provide magnetization recovery times of 4, 5 and 9, which are equal to or greater than the predetermined magnetization recovery time threshold value of 4 (one less than 5 slices).

As shown in FIG. 2B-FIG. 2D, varying magnetization recovery times between consecutive acquisitions of the same slices may be provided, which may result in artifacts in the image space. The occurrence of artifacts may be minimized, however, by inserting additional RF pulses to provide equal magnetization recovery times with a desirable additional scan time.

Figure 2E:
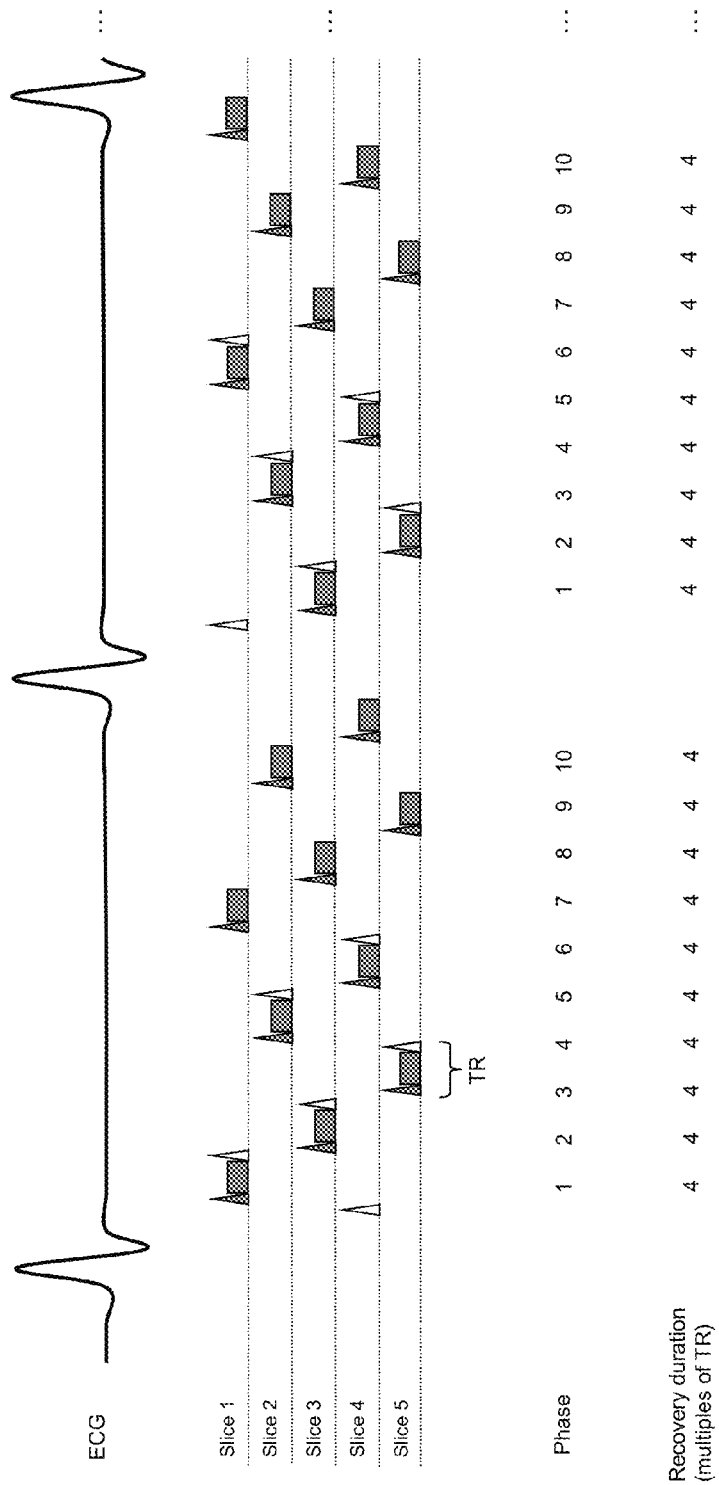
FIG. 2E is an illustration showing multi-slice, multi-phase system acquisition, using additional slice selective excitations to provide equal magnetization recovery times, for use with embodiments disclosed herein.

FIG. 2E is an illustration showing multi-slice, multi-phase system acquisition, using additional slice selective excitations to provide equal magnetization recovery times, for use with embodiments disclosed herein. As shown in FIG. 2E, additional RF pulses (with corresponding slice select gradients) beyond the amount of RF pulses shown in FIG. 2D may be inserted. These additional RF pulses are indicated as dummy RF pulses in FIG. 2E. A slight increase in TR (due to the corresponding dummy pulses) is shown in FIG. 2E to include the additional RF pulse and slice select gradient.

Figure 3:
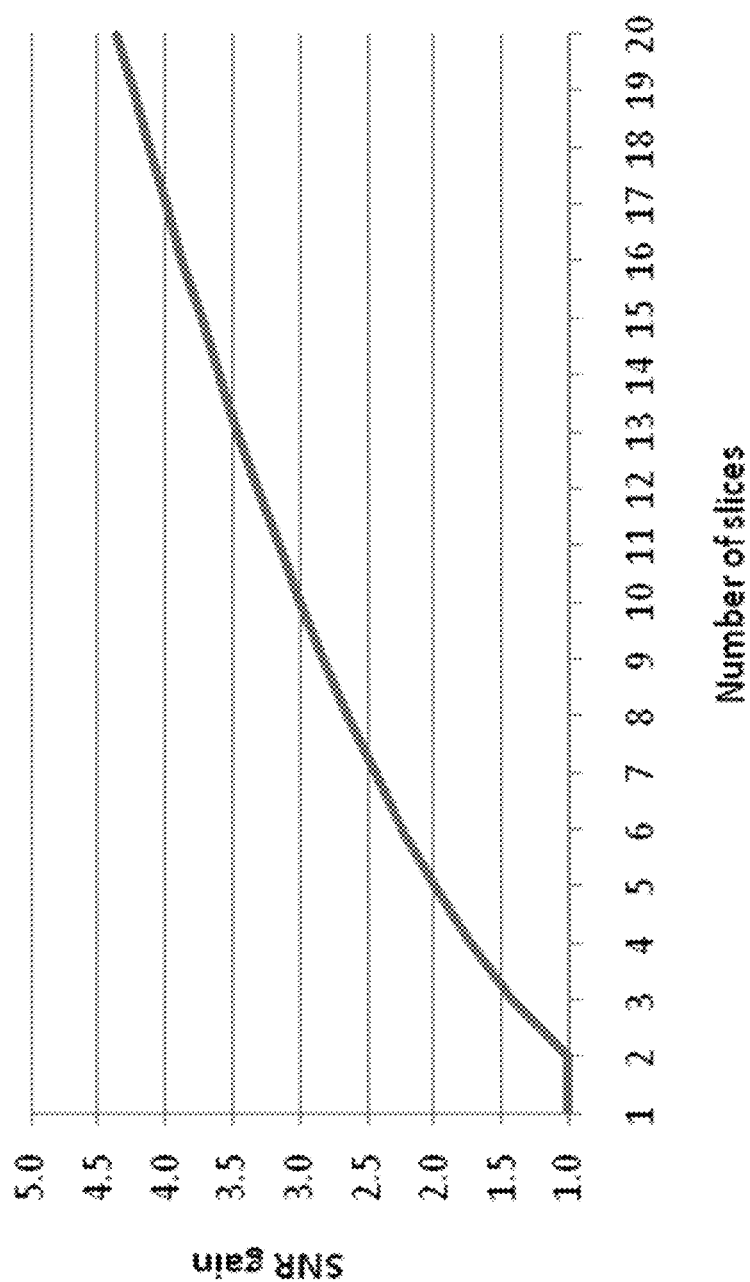
FIG. 3 is an illustration showing the resulting SNR gain as a function of the number of slices according to embodiments disclosed herein.

As described above with reference to FIG. 2B-2D, the predetermined magnetization recovery time threshold value may vary according to the number of slices (e.g., number of slices−1). FIG. 3 is an illustration showing the resulting SNR gain as a function of the number of slices. By changing the order of acquisition of slices between cycles 200 and providing magnetization recovery times greater than predetermined magnetization recovery time threshold values (e.g., number of slices−1), the SNR gain may increase as the number of slices increases, as shown in FIG. 3. For example, if 5 slices are acquired, the SNR can be doubled from 1.0 to 2.0. If 10 slices are acquired, the SNR can be increased 3 times to 3.0.

Figure 4A:
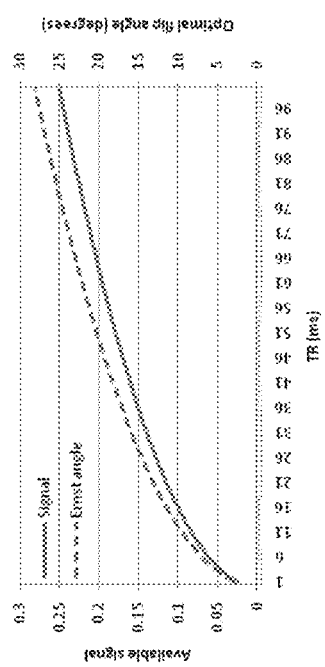
FIG. 4A, FIG. 4B and FIG. 4C are illustrations showing a signal acquired as a function of TR, according to embodiments disclosed herein.
Figure 4B:
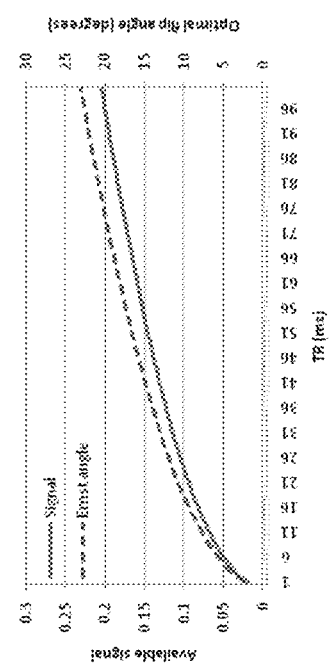
Figure 4C:
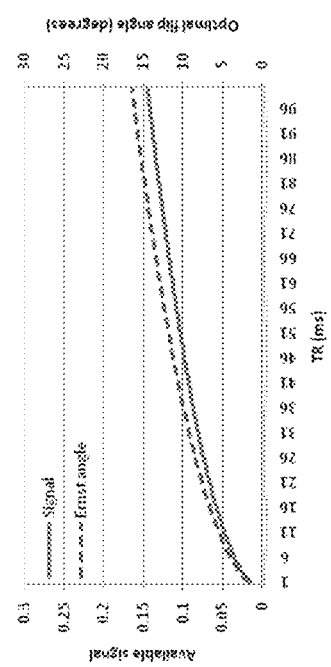

FIG. 4A, FIG. 4B and FIG. 4C are illustrations showing the signal acquired as a function of TR. FIG. 4A, FIG. 4B and FIG. 4C correspond to T1 values of 800 ms (typical of myocardium), 1200 ms (typical of blood), and 2400 ms, (typical of cerebrospinal fluid) at 1.5 Tesla, respectively. FIG. 4A shows the relationship between the available signal, the Ernst angle and the TR for tissues with a T1 of 800 ms, which is typically a value at 1.5 Tesla of blood. FIG. 4B shows the relationship between the available signal, the Ernst angle and the TR for tissues with a T1 of 1200 ms, which is typically a value at 1.5 Tesla of myocardium. FIG. 4C shows the relationship between the available signal, the Ernst angle and the TR for tissues with a T1 of 2400 ms which is typically a value at 1.5 Tesla of cerebrospinal fluid. As shown in FIG. 4A, FIG. 4B and FIG. 4C embodiments may image tissues with long T1, where the Ernst angle for gradient echo imaging is low and the available signal for imaging is consequently also low.

In one embodiment, for single phase volumetric imaging, the system may use a three dimensional (3D) imaging method to increase the signal compared to multi-slice imaging. Accounting for the increase in TR for slice interleaving, the Ernst angle for a multi-slice 2D case (shown in Equation [5A]) is higher than the Ernst angle for a 3D acquisition (shown in Equation [5B]).

$$\theta_{E\ 2D} = a\cos(e^{-N\ TR/T1})$$ Equation [5A]

$$\theta_{E\ 3D} = a\cos(e^{-TR/T1})$$ Equation [5B]

In Equation [5A] and Equation [5B], N is the number of 2D slices. The SNR for 2D sequences (shown in Equation [6A]) and the SNR for 3D sequences (shown in Equation [6B]) with the same voxel size are given by:

$$SNR_{2D} \propto \sqrt{N_{PE}T_{acq}}$$ Equation [6A]

$$SNR_{3D} \propto \sqrt{N_{PE}N_{SE}T_{acq}}$$ Equation [6B]

In Equation [6A] and Equation [6B], $T_{acq}$ is the time that the acquisition window is open to sample data, $N_{PE}$ is the number of phase encoding steps and $N_{SE}$ is the number of slice encoding steps. By combining Equations 4, 5A, 5B, 6A and 6B, a single phase 2D interleaved multi-slice sequence may be compared with a single phase 3D sequence, resulting in:

$$\frac{SNR_{2D}}{SNR_{3D}} = \sqrt{\frac{1 - e^{-2TR/T1}}{N_{SE}(1 - e^{-2NTR/T1})} \frac{(1 - e^{-NTR/T1})}{(1 - e^{-TR/T1})}}$$ Equation [7]

In Equation [7], N is the number of slices in the 2D acquisition. Table 1 shows a relative SNR for 2D multi-slice gradient echo acquisition compared to 3D gradient echo acquisition. Assuming an equal number of slices/partitions in both the 2D and 3D case, the values shown in Table 1 are derived from Equation [7]. Accordingly, for typical acquisitions, where TR<<T1, the 2D and 3D acquisitions have similar SNR. For single phase imaging, the sensitivity of 3D and interleaved multi-slice 2D sequences may be similar.

TABLE 1

|  |  | TR/T1 | | | |
|---|---|---|---|---|---|
|  |  | 0.001 | 0.01 | 0.1 | 1 |
| Slices | 2 | 1.00 | 1.00 | 1.00 | 0.91 |
|  | 3 | 1.00 | 1.00 | 1.00 | 0.81 |
|  | 4 | 1.00 | 1.00 | 0.99 | 0.72 |
|  | 5 | 1.00 | 1.00 | 0.99 | 0.65 |
|  | 6 | 1.00 | 1.00 | 0.99 | 0.60 |
|  | 7 | 1.00 | 1.00 | 0.98 | 0.56 |
|  | 8 | 1.00 | 1.00 | 0.98 | 0.52 |
|  | 9 | 1.00 | 1.00 | 0.97 | 0.49 |
|  | 10 | 1.00 | 1.00 | 0.96 | 0.47 |
|  | 11 | 1.00 | 1.00 | 0.95 | 0.44 |
|  | 12 | 1.00 | 1.00 | 0.95 | 0.42 |
|  | 13 | 1.00 | 1.00 | 0.94 | 0.41 |
|  | 14 | 1.00 | 1.00 | 0.93 | 0.39 |
|  | 15 | 1.00 | 1.00 | 0.92 | 0.38 |
|  | 16 | 1.00 | 1.00 | 0.91 | 0.37 |
|  | 17 | 1.00 | 1.00 | 0.90 | 0.36 |
|  | 18 | 1.00 | 1.00 | 0.89 | 0.35 |
|  | 19 | 1.00 | 1.00 | 0.88 | 0.34 |
|  | 20 | 1.00 | 1.00 | 0.87 | 0.33 |

Including the temporal reordering/shifting by adding an (N−1) factor for a 2D imaging application, Equation [7] becomes Equation [8] shown below.

$$\frac{SNR_{2D}}{SNR_{2D}} =$$ Equation [8]

$$\sqrt{N_{SE}} \sqrt{\frac{1 - e^{-2N(N-1)TR/T1}}{1 - e^{-2TR/T1}}} \frac{(1 - e^{-2TR/T1})}{(1 - e^{-2N(N-1)TR/T1})}$$

$$\frac{SNR_{2D}}{SNR_{3D}} = \sqrt{\frac{1 - e^{-2TR/T1}}{N_{SE}(1 - e^{-2N(N-1)TR/T1})} \frac{(1 - e^{-N(N-1)TR/T1})}{(1 - e^{-TR/T1})}}$$

Table 2 shows relative SNR for 2D multi-slice gradient echo acquisition with temporal reordering compared to 3D gradient echo acquisition. The values shown in Table 2 are a range of values derived using Equation [8]. Based on the values shown in Table 2, the system temporal shift method yields a significant gain in SNR for imaging with shorter T1 and a higher TR/T1 ratio.

TABLE 2

|  |  | TR/T1 | | | |
|---|---|---|---|---|---|
|  |  | 0.001 | 0.01 | 0.1 | 1 |
| Slices | 2 | 1.00 | 1.00 | 1.00 | 0.91 |
|  | 3 | 1.41 | 1.41 | 1.39 | 0.85 |
|  | 4 | 1.73 | 1.73 | 1.64 | 0.74 |
|  | 5 | 2.00 | 2.00 | 1.75 | 0.66 |
|  | 6 | 2.24 | 2.23 | 1.74 | 0.60 |
|  | 7 | 2.45 | 2.43 | 1.67 | 0.56 |
|  | 8 | 2.65 | 2.61 | 1.58 | 0.52 |
|  | 9 | 2.83 | 2.77 | 1.49 | 0.49 |
|  | 10 | 3.00 | 2.90 | 1.41 | 0.47 |
|  | 11 | 3.16 | 3.02 | 1.35 | 0.44 |
|  | 12 | 3.31 | 3.10 | 1.29 | 0.42 |
|  | 13 | 3.46 | 3.17 | 1.24 | 0.41 |
|  | 14 | 3.60 | 3.21 | 1.20 | 0.39 |
|  | 15 | 3.73 | 3.23 | 1.16 | 0.38 |
|  | 16 | 3.86 | 3.23 | 1.12 | 0.37 |
|  | 17 | 3.99 | 3.21 | 1.09 | 0.36 |
|  | 18 | 4.11 | 3.18 | 1.05 | 0.35 |
|  | 19 | 4.22 | 3.14 | 1.03 | 0.34 |
|  | 20 | 4.33 | 3.09 | 1.00 | 0.33 |

The system is compatible with gradient echo readout methods (e.g., including EPI, spiral, radial) and may be used with steady state free precession (SSFP) methods if combined with additional methods to avoid or minimize artifacts to the steady state interrupt such as by pairing of phase encoding (k-space segments) or transient RF-excitation methods.

In some applications, such as cerebrospinal fluid (CSF) flow imaging, where the T1 is long, gradient echo imaging offers a low SNR. Balanced SSFP provides a high SNR for CSF (e.g., 2-5 times more) compared to known gradient echo imaging. Reliable SSFP imaging may be more difficult to achieve at higher field strengths, however, whereas gradient echo imaging remains relatively robust. The system may also be advantageous for CSF flow imaging, particularly at high field strengths.

Embodiments of the invention may improve the SNR of tissue species. The improvement may be pronounced for species with a long T1 (e.g., cerebrospinal fluid, blood, and brain gray matter). For segmented multi-slice imaging, the increase in SNR may be achieved without increasing the scan time. When dummy RF pulses are inserted, the scan time may be slightly increased to accommodate these pulses (and corresponding slice select gradients).

Figure 5:
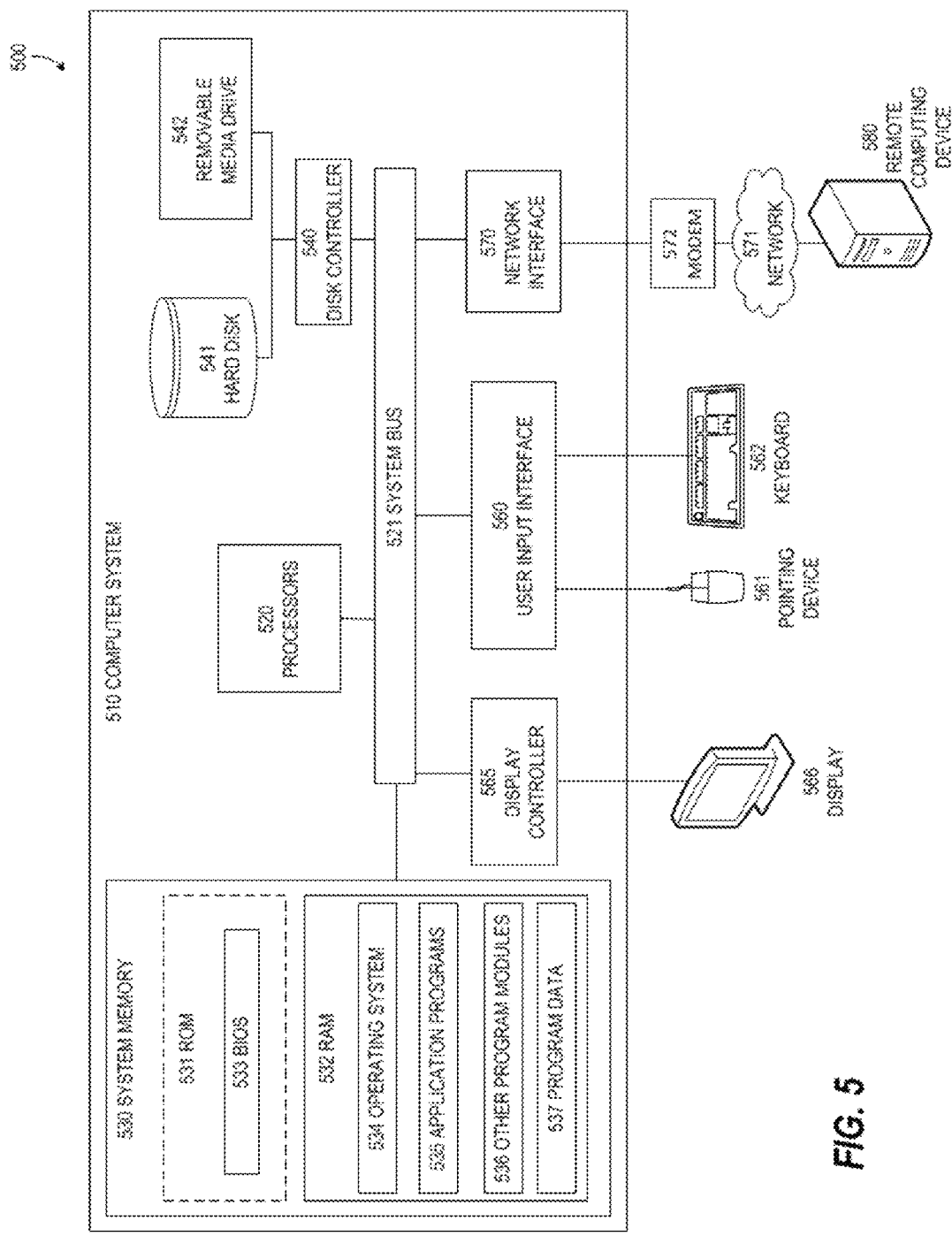
FIG. 5 illustrates an example of a computing environment within which embodiments of the invention may be implemented.

FIG. 5 illustrates an example of a computing environment 500 within which embodiments of the invention may be implemented. Computing environment 500 may include computer system 510, which is one example of a computing system upon which embodiments of the invention may be implemented. As shown in FIG. 5, the computer system 510 may include a communication mechanism such as a bus 521 or other communication mechanism for communicating information within the computer system 510. The system 510 further includes one or more processors 520 coupled with the bus 521 for processing the information. The processors 520 may include one or more CPUs, GPUs, or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a magnetic hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display or monitor 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processor 520. The pointing device 561, for example, may be a mouse, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any non-transitory, tangible medium that participates in providing instructions to the processor 520 for execution. A computer readable medium may take many forms including, but not limited to, nonvolatile media, volatile media, and transmission media. Non-limiting examples of nonvolatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 520 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer 510. When used in a networking environment, computer 510 may include modem 562 for establishing communications over a network 571, such as the Internet. Modem 562 may be connected to system bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computing system 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The GUI also includes an executable procedure or executable application. The executable procedure or executable application conditions the display processor to generate signals representing the GUI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the GUI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of the figures presented herein are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIG. 5. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

Figure 6:
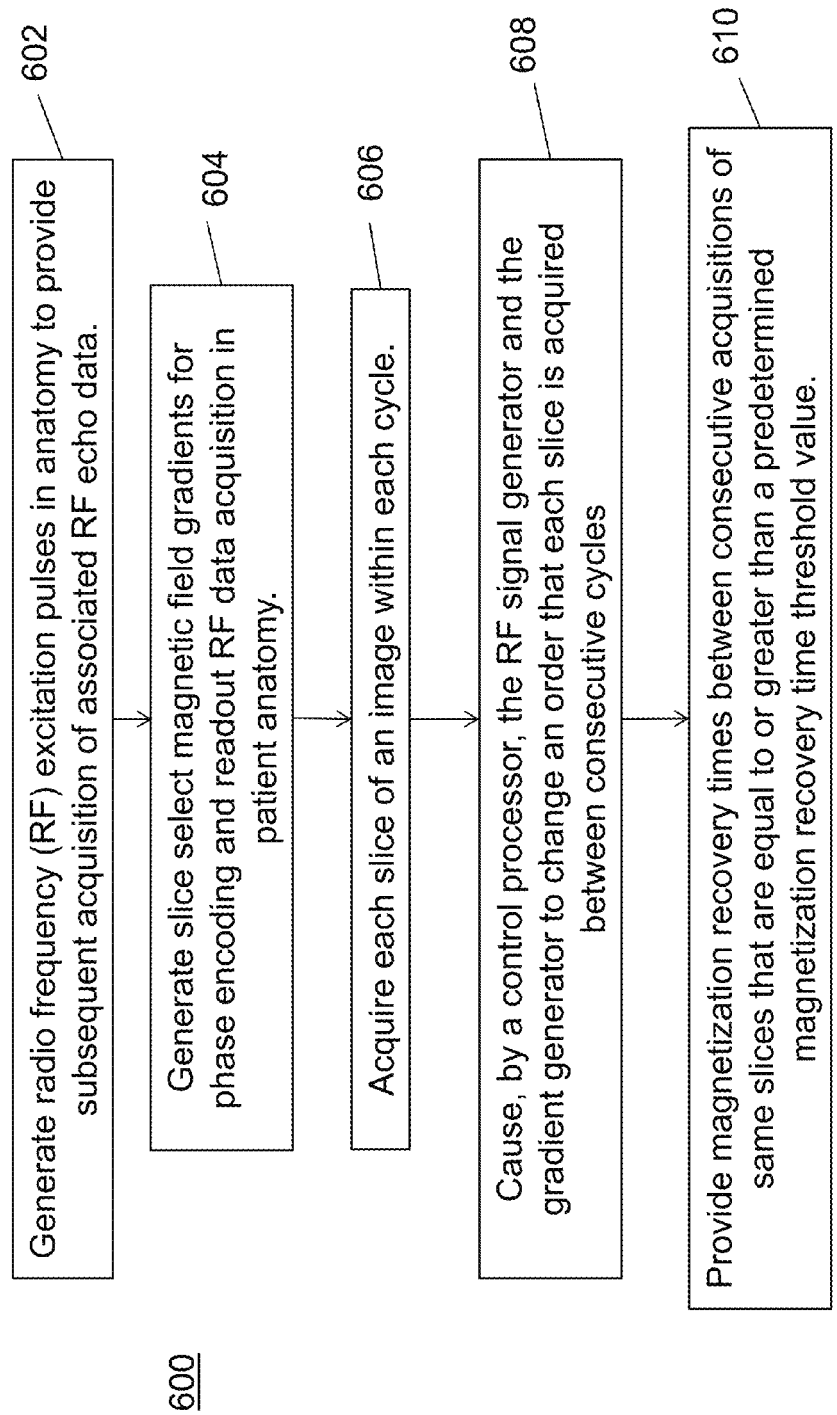
FIG. 6 is a flow diagram illustrating an exemplary method for operating a Magnetic Resonance (MR) imaging system for use with embodiments disclosed herein.

FIG. 6 is a flow diagram illustrating an exemplary method 600 for operating a Magnetic Resonance (MR) imaging system for use with embodiments disclosed herein. As shown at step 602 in FIG. 6, the method 600 may include generating radio frequency (RF) excitation pulses in patient anatomy to provide subsequent acquisition of associated RF echo data. For example, one or more RF signal generators (e.g., RF signal generator units 18 and 20) may generate radio frequency (RF) excitation pulses in patient anatomy to provide subsequent acquisition of associated RF echo data.

As shown at step 604 in FIG. 6, the method 600 may include generating slice select magnetic field gradients for phase encoding and readout RF data acquisition in the patient anatomy. For example, one or more gradient generators (e.g., magnetic field gradient generator units 12 and 14) generating slice select magnetic field gradients for phase encoding and readout RF data acquisition in the patient anatomy.

As shown at step 606 in FIG. 6, the method 600 may include acquiring each of the slices of an image within each of the cycles 200. For example, RF coils 18 may acquire each slice (1, 2, 3, 4 and 5 shown in the Slice row of FIG. 2A) of an image within each of the cycles 200 shown in FIG. 2A.

As shown at step 608 in FIG. 6, the method 600 may include causing, by a control processor, the RF signal generator and the gradient generator to change an order that each slice is acquired between consecutive cycles of the plurality of cycles 200. For example, a control processor (e.g., central control unit 26), may cause one or more RF signal generators (e.g., RF signal generator units 18 and 20) and one or more gradient generators (e.g., magnetic field gradient generator units 12 and 14) to change the order that the slices (1, 2, 3, 4, and 5) are acquired between consecutive cycles (cycle 1, cycle 2, . . . ) of cycles 200.

As shown at step 610 in FIG. 6, the method 600 may include providing magnetization recovery times between consecutive acquisitions of same slices that are equal to or greater than a predetermined magnetization recovery time threshold value. For example, in the embodiment shown in FIG. 2B, there are 5 slices of an image acquired and the predetermined magnetization recovery time threshold value is equal to 4 (1 less than 5 slices). Accordingly, the order of acquisition is changed between the first and second cycles of cycles 200 such that the magnetization recovery times between consecutive acquisitions of the same slices is equal to 4 (e.g., the magnetization recovery time between consecutive acquisitions of slice 2 in cycle 1 and slice 2 in cycle 2 is equal to 4 time intervals) or greater than 4 (e.g., the magnetization recovery time between consecutive acquisitions of slice 5 in cycle 1 and slice 5 in cycle 2 is equal to 9 time intervals). Embodiments may include magnetization recovery time threshold values other than 4. Magnetization recovery time threshold values may vary according to different factors, such as the number of slices acquired and/or the number of phase intervals per cycle.

Although the invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

The invention claimed is:
1. A method for operating a Magnetic Resonance (MR) imaging system, the method comprising:
  generating radio frequency (RF) excitation pulses in patient anatomy to provide subsequent acquisition of associated RF echo data;

generating slice select magnetic field gradients for phase encoding and readout RF data acquisition in the patient anatomy;

acquiring a segment of a plurality of segments of k-space data for each of a plurality of slices of an imaged volume within each of a plurality of cycles; and causing, by a control processor, a RF signal generator and a gradient generator to change an order of the slices that the segments of k-space data are acquired for between consecutive cycles of the plurality of cycles.

2. The method according to claim 1, further comprising changing the order of slices that the segments of k-space data are acquired for between consecutive cycles to provide magnetization recovery time multiples between consecutive acquisitions of the segments of k-space data for the same slices that are equal to or greater than a predetermined magnetization recovery time threshold value.

3. The method according to claim 2, wherein
the plurality of slices is equal to n number of slices and the predetermined magnetization recovery time multiple threshold value is equal to one less than n number of slices.

4. The method according to claim 1, further comprising changing the order of slices that the segments of k-space data are acquired for between consecutive cycles to provide different magnetization recovery times between consecutive acquisition of the segments of k-space data for at least two of the acquired plurality of slices.

5. The method according to claim 1, further comprising changing the order of slices that the segments of k-space data are acquired between consecutive cycles to provide substantially equal magnetization recovery times between each of the consecutive acquisitions of the segments of k-space data for the same slices.

6. The method according to claim 1, further comprising changing the order of slices that the segments of k-space data are acquired for between consecutive cycles to provide an average magnetization recovery time between each of the consecutive acquisitions of the segments of k-space data for the same slices within each cycle that is equal to or greater than a predetermined average magnetization recovery time threshold value.

7. The method according to claim 1, wherein
the plurality of slices comprises at least three slices.

8. The method according to claim 1, wherein
the causing the RF signal generator and the gradient generator to change an order of slices that the segments of k-space data are acquired for further comprises interleaving the acquisition order of the plurality of slices.

9. A multi-slice, multi-segment magnetic resonance (MR) imaging system, comprising:
a radio frequency (RF) signal generator configured to generate RF excitation pulses in patient anatomy and enabling subsequent acquisition of associated RF echo data;
a magnetic field gradient generator configured to generate slice select magnetic field gradients for phase encoding and readout RF data acquisition in the patient anatomy;
a plurality of RF coils configured to acquire a segment of a plurality of segments of k-space data for each of a plurality of slices of an imaged volume within each of a plurality of cycles; and
a controller configured to cause: (i) the RF signal generator to generate the RF excitation pulses; and (ii) the magnetic field generator to generate the corresponding slice select magnetic field gradients to change an order of the slices that the segments of k-space data are acquired for between consecutive cycles of the plurality of cycles.

10. The system according to claim 9, wherein
the controller is further configured to cause: (i) the RF signal generator to generate the RF excitation pulses; and (ii) the magnetic field generator to generate the corresponding slice select magnetic field gradients to change the order of slices that the segments of k-space data are between consecutive cycles to provide magnetization recovery times between consecutive acquisitions of segments of k-space data for the same slices that are equal to or greater than a predetermined magnetization recovery time threshold value.

11. The system according to claim 10, wherein
the plurality of slices is equal to n number of slices and the predetermined magnetization recovery time threshold value is equal to one less than n number of slices.

12. The system according to claim 10, wherein
the controller is further configured to cause: (i) the RF signal generator to generate the RF excitation pulses; and (ii) the magnetic field generator to generate the corresponding slice select magnetic field gradients to change the order of slices that the segments of k-space data are acquired for between consecutive cycles to provide different magnetization recovery times between consecutive acquisition of the segments of k-space data for at least two of the plurality of slices.

13. The system according to claim 10, wherein
the controller is further configured to cause: (i) the RF signal generator to generate the RF excitation pulses; and (ii) the magnetic field generator to generate the corresponding slice select magnetic field gradients to change the order of slices that the segments of k-space data are acquired between consecutive cycles to provide substantially equal magnetization recovery times between each of the consecutive acquisitions of the segments of k-space data for the same slices.

14. The system according to claim 10, wherein
the controller is further configured to cause: (i) the RF signal generator to generate the RF excitation pulses; and (ii) the magnetic field generator to generate the corresponding slice select magnetic field gradients to change the order of slices that the segments of k-space data are acquired for between consecutive cycles to provide an average magnetization recovery time between each of the consecutive acquisitions of the same slices within each cycle that is equal to or greater than a predetermined average magnetization recovery time threshold value.

15. The system according to claim 9, wherein
the plurality of slices comprises at least three slices.

16. The system according to claim 9, wherein
the controller is further configured to cause: (i) the RF signal generator to generate the RF excitation pulses; and (ii) the magnetic field generator to generate the corresponding slice select magnetic field gradients to change the order of slices that the segments of k-space data are acquired for by interleaving the acquisition order of the plurality of slices.

17. An article of manufacture for operating a multi-slice, multi-segment magnetic resonance (MR) imaging system, the article of manufacture comprising a non-transitory, tangible computer-readable medium holding computer-executable instructions for performing a method comprising:

generating radio frequency (RF) excitation pulses in patient anatomy to provide subsequent acquisition of associated RF echo data;

generating slice select magnetic field gradients for phase encoding and readout RF data acquisition in the patient anatomy;

acquiring a segment of a plurality of segments of k-space data for each of a plurality of slices of an imaged volume within each of a plurality of consecutive cycles; and causing an order of the slices that the segments of k-space data are acquired for to change between the plurality of consecutive cycles.

18. The article of manufacture of claim 17, wherein causing an order of slices that the segments of k-space data are acquired for to change between each of the plurality of consecutive cycles provides magnetization recovery times between consecutive acquisitions of segments of k-space data for the same slices that are equal to or greater than a predetermined magnetization recovery time threshold value.

19. The article of manufacture of claim 18, wherein the plurality of slices is equal to n number of slices and the predetermined magnetization recovery time threshold value is equal to one less than n number of slices.

20. The article of manufacture of claim 18, wherein causing an order of slices that the segments of k-space data are acquired for to change further comprises changing the order to provide different magnetization recovery times between consecutive acquisition of segments of k-space data for at least two of the plurality of slices.

* * * * *